United States Patent
Murr et al.

[11] Patent Number: 6,132,225
[45] Date of Patent: Oct. 17, 2000

[54] PRESS-IN PIN WITH AN ELASTIC PRESS-IN REGION

[75] Inventors: Alfred Murr, deceased, late of München; by Karin Murr, heir, München; by Ulrike Inge Murr, heir, Bamberg; by Andreas Uwe Murr, heir, München; by Matthias Erich Murr, heir, München; Rolf Metzger, München; Alexander Wagner, Roemerberg, all of Germany

[73] Assignee: TYCO Electronic Logistics AG, Steinach, Switzerland

[21] Appl. No.: 08/938,864

[22] Filed: Sep. 26, 1997

[30] Foreign Application Priority Data

Sep. 26, 1996 [DE] Germany ............. 196 39 688

[51] Int. Cl.$^7$ .................................. H01R 12/00
[52] U.S. Cl. ............................ 439/82; 439/751
[58] Field of Search ................ 439/82, 751, 873, 439/888

[56] References Cited

U.S. PATENT DOCUMENTS

| | | | |
|---|---|---|---|
| 4,381,134 | 4/1983 | Anselmo et al. | 439/82 |
| 4,776,807 | 10/1988 | Triner et al. | 439/82 |
| 4,867,710 | 9/1989 | Harting et al. | 439/751 |
| 5,667,412 | 9/1997 | Takahashi et al. | 439/751 |

FOREIGN PATENT DOCUMENTS

| | | |
|---|---|---|
| 3831508A1 | 3/1990 | Germany . |
| 4422876A1 | 1/1995 | Germany . |

OTHER PUBLICATIONS

Japanese Patent Abstract No. 08031476 A (Mutsumi et al.), dated Feb. 2, 1996.

*Primary Examiner*—Renee Luebke
*Assistant Examiner*—T. C. Patel
*Attorney, Agent, or Firm*—Herbert L. Lerner; Laurence A. Greenberg; Werner H. Stemer

[57] ABSTRACT

A press-in pin includes an elastic, cross sectionally bow-shaped press-in region having a bow section, two longitudinal sides and lateral flares at opposing locations on the two longitudinal sides. In a pressed-in condition, the press-in region rests against a bore wall only with the flares, but not with the bow section. Such a press-in pin has a very favorable resilience behavior and practically speaking, is only elastically deformed.

16 Claims, 3 Drawing Sheets

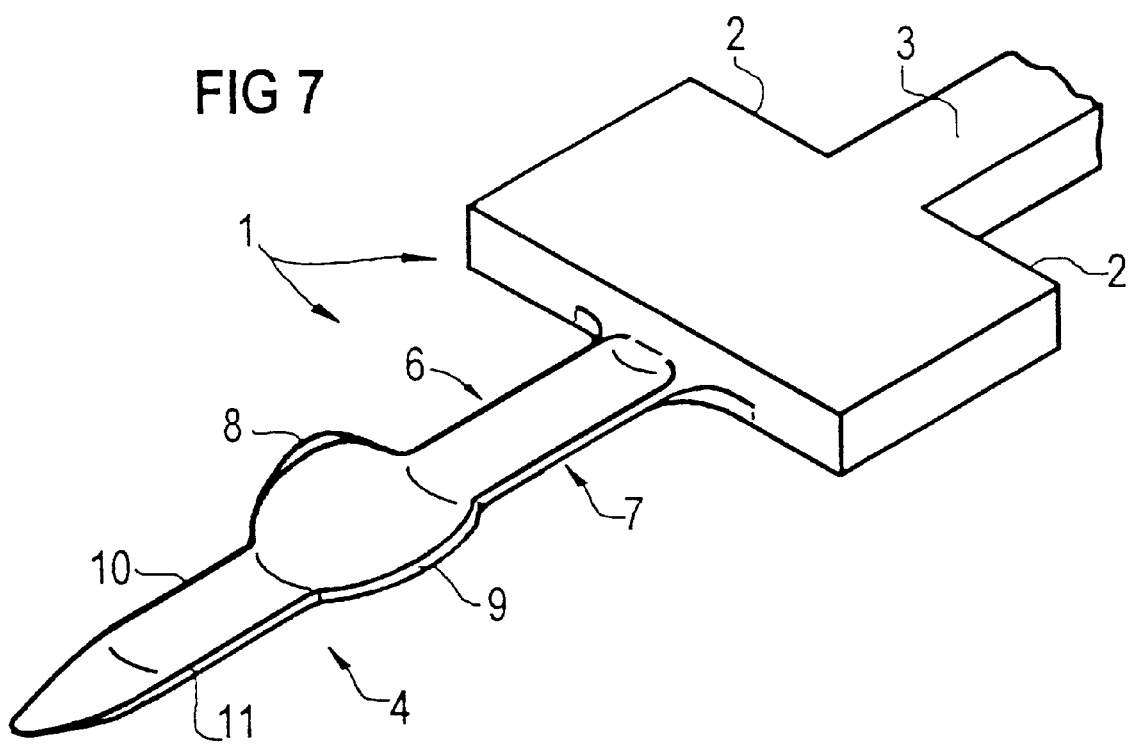

PRESS-IN PIN WITH AN ELASTIC PRESS-IN REGION

BACKGROUND OF THE INVENTION

Field of the Invention

The invention relates to a press-in pin with an elastic, cross sectionally bow-shaped press-in region for a solder-free, mechanical and/or electrical connection in a bore of a plate-shaped substrate, in particular for producing a solder-free connection with a metallized or through contacted bore of a printed circuit board.

Many embodiments of such press-in pins are known with elastic press-in zones of different cross sectional shapes, such as in so-called letter press-in technology with elastic press-in zones having cross sections that are, for example, C, H, S, or Z-shaped. With press-in pins having an elastic, cross sectionally bow-shaped press-in region, the cross sections are arc-shaped, sickle-shaped, or C-shaped. A press-in pin that has become known by the name "C-Press", which was disclosed in U.S. Pat. No. 4,017,143, has an elastic, cross sectionally C-shaped press-in zone that is consequently to a large extent adapted to a connection hole and produces as large as possible a contact area of both parts, since the press-in zone contacts the wall of the connection hole over its entire length and entire outer periphery. The C-press pin requires relatively low press-in forces and with multiple pressings into the same hole, can be exchanged more often than other pins. Furthermore, C-press-in pins are also known, which only contact the wall of the connection hole at three points, i.e. at the apex and at the two ends of the bow (Tri-C-Flex press-in pins).

With press-in pins that have an elastic press-in zone, a plastic, permanent deformation of the press-in region is also produced in addition to the elastic deformation. Flexible press-in pins, i.e. press-in pins with an elastic press-in region, can in fact fundamentally be plugged into the same hole several times, but it has turned out that the elasticity behavior changes, i.e. the elastic component decreases more and more and the press-in region is increasingly plastically deformed. As a result, the reliability of the press-in connection is impaired and the possibility of multiple press-ins is sharply limited.

SUMMARY OF THE INVENTION

It is accordingly an object of the invention to provide a press-in pin with an elastic press-in region, which overcomes the hereinafore-mentioned disadvantages of the heretofore-known devices of this general type and which improves the elasticity behavior of the flexible press-in region.

With the foregoing and other objects in view there is provided, in accordance with the invention, a press-in pin to be mechanically and/or electrically connected without solder in a bore in a plate-shaped substrate, in particular in a metallized or through-contacted bore in a printed circuit board, comprising an elastic, cross sectionally bow-shaped press-in region having two longitudinal sides and lateral flares at mutually opposite locations on the two longitudinal sides, only the flares contacting a wall of the bore in a pressed-in condition of the press-in region.

With a press-in pin of this kind, the press-in region, with the opposing lateral flares that protrude beyond its normal width, is constructed in such a way that on one hand it has an elastic, cross sectionally bow-shaped press-in region and on the other hand when pressed in, it does not contact the bore wall over the entire length of the press-in region on both ends of the bow or on the entire outer periphery of the bow, but instead only contacts the bore wall with the contact points or locations of the lateral flares. In this manner, a very favorable resilience behavior of the press-in region is produced, i.e. the elasticity behavior of the press-in region practically does not change, even when pressed in a number of times, so that an almost exclusively elastic deformation occurs, with the elastic component of the deformation also remaining virtually constant over a longer time and for numerous press-in cycles and in practical terms, the press-in region is hardly deformed plastically at all. As a result, a high reliability of the press-in connection is assured even with multiple press-ins. Furthermore, a press-in pin of this kind additionally has the advantage of producing a generally sufficiently great securing force with a favorable insertion behavior of the press-in region and relatively low press-in and press-out forces.

The press-in pin according to the invention is also excellently suited for very small embodiments and therefore can be used to great advantage with multiple press-in connections having a small reciprocal spacing, e.g. for press-in fastening of components, structural parts, or electrical plug connectors with very small catch dimensions.

In accordance with another feature of the invention, the press-in region has a longitudinal direction and a bow-shaped section with the longitudinal edges, and the lateral flares are extensions extended in the longitudinal direction on the longitudinal edges.

In accordance with a further feature of the invention, the bow-shaped section has bow ends as seen in cross section, and the lateral flares are disposed on the bow ends.

In accordance with an added feature of the invention, the bow-shaped section has a curvature, and the lateral flares extend in the curvature.

In accordance with an additional feature of the invention, the press-in region has a longitudinal direction, and the lateral flares increasingly widen in the longitudinal direction, are rounded in a bow shape at an apex and narrow again in the longitudinal direction outside the apex.

In accordance with yet another feature of the invention, the press-in region has a longitudinal central axis, and the lateral flares are disposed and constructed symmetrically with regard to the longitudinal central axis.

In accordance with yet a further feature of the invention, the elastic press-in region has a cross section with a maximal width of approximately 0.3 mm and a maximal width of approximately 0.4 mm at the lateral flares.

In accordance with yet an added feature of the invention, the elastic press-in region has one end with press-in shoulders for a press-in tool.

In accordance with a concomitant feature of the invention, the elastic press-in region is disposed at one end of the press-in pin, and there is provided a heavy region disposed at another end of the press-in pin, such as a heavy press-in zone or a heavy connection or contact region.

Other features which are considered as characteristic for the invention are set forth in the appended claims.

Although the invention is illustrated and described herein as embodied in a press-in pin with an elastic press-in region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is a fragmentary, perspective view of the press-in pin.

DESCRIPTION OF THE PREFERRED EMBODIMENTS

Figure 1:
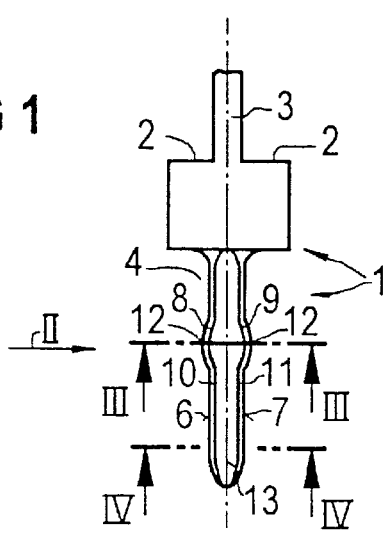
FIG. 1 is a fragmentary, diagrammatic, top-plan view of a press-in pin.
Figure 2:
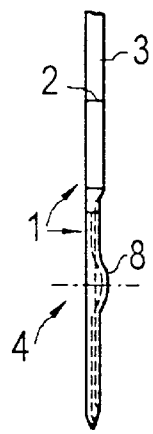
FIG. 2 is a fragmentary, side-elevational view of the press-in pin, which is taken in the direction of an arrow II in FIG. 1.

Referring now to the figures of the drawings in detail and first, particularly, to FIGS. 1, 2 and 7 thereof, there is seen a press-in pin 1 which is constructed with press-in shoulders 2 that are engaged by a non-illustrated press-in tool, for pressing into a bore of a plate-shaped substrate.

The press-in pin 1 has a heavy region 3 on the side of the press-in shoulders 2, which is constructed, for example, as a pin that is rectangular in cross section and as such constitutes a heavy press-in zone or also constitutes a heavy connection or contact region. The pin-shaped region 3 is used, for example, as a heavy press-in zone for the press-in fastening of an electric or electronic component, which for its part is disposed, for example, on a printed circuit board and can be connected to another external printed circuit board through the use of the elastic press-in connection. The pin-shaped region 3 can be used as a heavy connection or contact region when used as a contact pin, for example of an electric plug connector, in particular a male multipoint connector. However, in lieu of a heavy region, in the event that it is used as a contact element, the region 3 can also be constructed as a sleeve-shaped contact element and can then constitute a contact spring of a multi-pole female connector.

Figure 4:
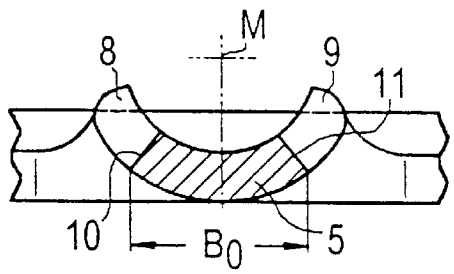
FIG. 4 is a fragmentary, cross-sectional view through the elastic press-in region of the press-in pin, which is taken along a line IV—IV of FIG. 1, in the direction of the arrows.

The press-in pin 1 has an elastic, cross sectionally bow-shaped press-in region 4 on the other end, i.e. on the side opposite the press-in shoulders 2, which has the cross sectional shape of a section of an arc 5 with an arc center point M, in the illustrated exemplary embodiment. In this case the arc or bow-shaped section 5 is constructed to be approximately sickle-shaped and smaller than a C. The cross-sectional shape of the press-in region 4 is shown clearly in the sectional view according to FIG. 4, wherein a maximal width of the press-in region 4, i.e. a normal width of the press-in region over its entire length, is indicated by reference symbol $B_0$ and in very small press-in pins, for example, is approximately 0.3 mm. Furthermore, the press-in region 4 is tapered on its free end in order to assure a good insertion behavior of the press-in pin.

Figure 3:
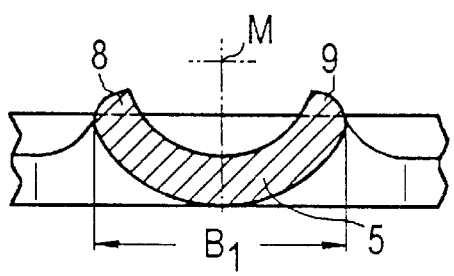
FIG. 3 is a fragmentary, cross-sectional view through the elastic press-in region of the press-in pin, which is taken along a line III—III of FIG. 1, in the direction of the arrows.

The essential feature of the press-in pin 1 according to the invention is that the bow-shaped press-in region 4 has lateral flares 8 and 9 at opposite points on two longitudinal sides 6 and 7. These flares are constructed in this case as extensions provided on longitudinal edges 10 and 11 of the bow-shaped section 5, i.e. they are provided on the ends of the bow as seen in cross section. These extensions extend in the curvature of the bow-shaped section 5 and extend in the longitudinal direction of the press-in region 4. The extensions that constitute the lateral flares 8 and 9 increasingly widen in the longitudinal direction of the press-in region 4, are rounded in a bow shape at an apex 12, and then after this apex, narrow again in the longitudinal direction of the press-in region toward its free end. As can be clearly inferred from FIGS. 1 and 5, the lateral flares 8 and 9 are disposed and constructed symmetrically with regard to a longitudinal central axis 13 of the press-in region. The press-in region 4 has a maximal width indicated by reference symbol $B_1$ in FIG. 3 at the location of the lateral flares 8 and 9, i.e. precisely at the point of the apex 12. In very small press-in pins, this width $B_1$ can, for example, be approximately 0.4 mm when the width $B_0$ is approximately 0.3 mm. These dimensions are only exemplary indications for very small press-in pins, but they clarify that a press-in pin of this kind can also be used with multiple press-in connections having a small reciprocal spacing, i.e. with press-in connections that have very small catch dimensions, for example.

Figure 5:
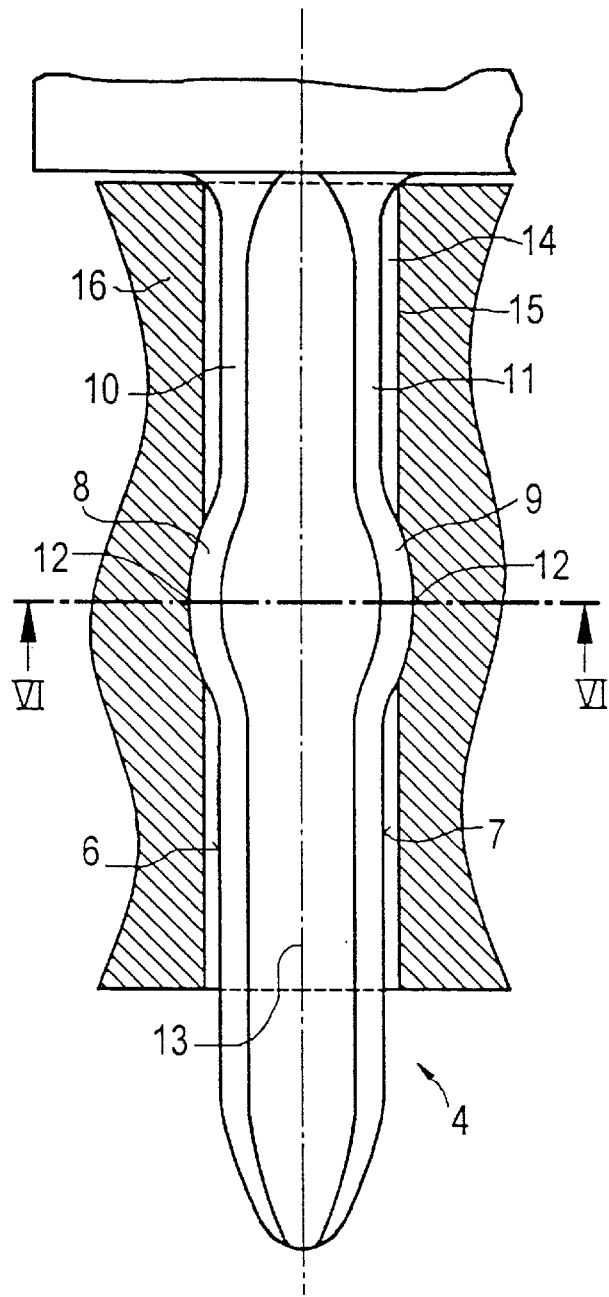
FIG. 5 is an enlarged, fragmentary, sectional view through the press-in region, showing the press-in pin plugged into a bore of a substrate.
Figure 6:
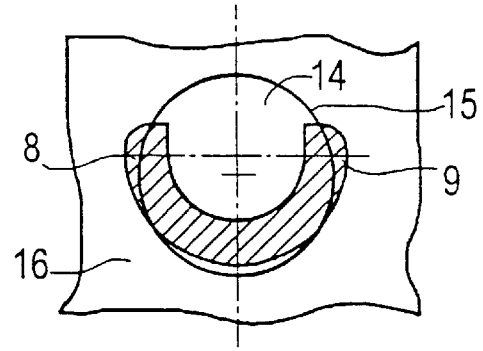
FIG. 6 is a fragmentary, cross-sectional view taken along a line VI—VI of FIG. 5, in the direction of the arrows.

FIGS. 5 and 6 show a press-in connection when plugged into a plate-shaped substrate. This can be a press-in connection in a through-contacted bore 14 of a printed circuit board 16. In a greatly enlarged and therefore very clear fashion, FIGS. 5 and 6 show that when the press-in pin 1 is pressed in, the bow-shaped press-in region 4 only contacts a metallized wall 15 of the bore 14 with the lateral flares 8 and 9, but not with the longitudinal edges 10 and 11 and the outer periphery of the bow-shaped section 5. The lateral flares 8 and 9 each penetrate slightly into the bore wall 15 with their apexes 12 and with regions adjacent these apexes as is seen in the longitudinal direction of the press-in region 4.

In the illustrated exemplary embodiment, the press-in pin 1 is constructed as having lateral flares 8 and 9 at two opposing points in the course of the longitudinal direction of the press-in region 4. However, in addition to these two lateral flares 8 and 9, it is possible to construct the press-in region 4 as having other lateral flares disposed opposite each other at another point, or if need be at several other points in the course of its longitudinal direction.

The press-in pin 1 which is depicted is produced in a stamping and bending process, wherein the lateral flares are formed in the stamping process and the press-in region 4 obtains its bow-shaped cross section in a bending process, with the lateral flares extending in the curvature of the bow.

We claim:

1. A press-in pin to be at least one of mechanically and electrically connected without solder to a bore in a plate-shaped substrate, comprising:

an elastic press-in region having two longitudinal sides and lateral flares at mutually opposite locations on said two longitudinal sides, only said flares contacting a wall of a bore in said plate-shaped substrate in a pressed-in condition of said press-in region, wherein said press-in region has a longitudinal direction and a bow-shaped section with longitudinal edges, and said lateral flares are extensions extended in the longitudinal direction on said longitudinal edges.

2. The press-in pin according to claim 1, wherein only said flares contact a wall of a metallized bore in a printed circuit board in the pressed-in condition of said press-in region.

3. The press-in pin according to claim 1, wherein only said flares contact a wall of a through-contacted bore in a printed circuit board in the pressed-in condition of said press-in region.

4. The press-in pin according to claim 1, wherein said bow-shaped section has bow ends as seen in cross section, and said lateral flares are disposed on said bow ends.

5. The press-in pin according to claim 1, wherein said bow-shaped section has a curvature, and said lateral flares extend in said curvature.

6. The press-in pin according to claim 1, wherein said press-in region has a longitudinal direction, and said lateral flares increasingly widen in the longitudinal direction, are rounded in a bow shape at an apex and narrow again in the longitudinal direction outside said apex.

7. The press-in pin according to claim 1, wherein said press-in region has a longitudinal central axis, and said lateral flares are disposed and constructed symmetrically with regard to said longitudinal central axis.

8. The press-in pin according to claim 1, wherein said elastic press-in region has a cross section with a maximal width of approximately 0.3 mm and a maximal width of approximately 0.4 mm at said lateral flares.

9. The press-in pin according to claim 1, wherein said elastic press-in region has one end with press-in shoulders for a press-in tool.

10. The press-in pin according to claim 1, wherein said elastic press-in region is disposed at one end of the press-in pin, and including a heavy region disposed at another end of the press-in pin.

11. The press-in pin according to claim 10, wherein said heavy region is a heavy press-in zone.

12. The press-in pin according to claim 10, wherein said heavy region is a heavy connection region.

13. The press-in pin according to claim 10, wherein said heavy region is a heavy contact region.

14. A press-in pin and substrate assembly, comprising:

a plate-shaped substrate having a bore formed therein defining a wall of said bore; and a press-in pin to be at least one of mechanically and electrically connected without solder in said bore, said press-in pin having an elastic press-in region with two longitudinal sides and lateral flares at mutually opposite locations on said two longitudinal sides, only said flares contacting said wall in a pressed-in condition of said press-in region, wherein said press-in region has a longitudinal direction and a bow-shaped section with longitudinal edges, and said lateral flares are extensions extended in the longitudinal direction on said longitudinal edges.

15. The press-in pin according to claim 14, wherein said substrate is a printed circuit board and said bore is metallized.

16. The press-in pin according to claim 14, wherein said substrate is a printed circuit board and said bore is a metallized bore.

* * * * *